US010566301B2

(12) United States Patent
Fillion et al.

(10) Patent No.: US 10,566,301 B2

(45) Date of Patent: Feb. 18, 2020

(54) SEMICONDUCTOR LOGIC DEVICE AND SYSTEM AND METHOD OF EMBEDDED PACKAGING OF SAME

(71) Applicant: General Electric Company, Schenectady, NY (US)

(72) Inventors: Raymond Albert Fillion, Niskayuna, NY (US); Kaustubh Ravindra Nagarkar, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 89 days.

(21) Appl. No.: 15/816,360

(22) Filed: Nov. 17, 2017

(65) Prior Publication Data

US 2019/0157227 A1 May 23, 2019

(51) Int. Cl.

*H01L 23/00* (2006.01)

*H01L 23/528* (2006.01)

(Continued)

(52) U.S. Cl.

CPC ............ *H01L 24/06* (2013.01); *H01L 21/565* (2013.01); *H01L 23/3121* (2013.01);

(Continued)

(58) Field of Classification Search

CPC ... H01L 24/06; H01L 23/5286; H01L 21/565; H01L 25/50; H01L 25/13; H01L 24/13; H01L 25/105; H01L 25/0655; H01L 23/50; H01L 24/20; H01L 24/19; H01L 23/3121; H01L 225/1041; H01L 2924/2064; H01L 2924/20641; H01L 2924/1431;

(Continued)

(56) References Cited

U.S. PATENT DOCUMENTS 5,341,564 A 8/1994 Akhavain et al.

5,353,498 A 10/1994 Fillion et al.

(Continued)

OTHER PUBLICATIONS

Tanaka et al., "Thinner and Miniature Embedded Device Package, MCeP, for PoP and Module Application", Shinko Electric Industries Co., Ltd., 45th International Symposium on Microelectronics, Sep. 9-13, 2012, San Diego, CA, pp. 001010-001017.

(Continued)

*Primary Examiner* — Alexander O Williams

(74) *Attorney, Agent, or Firm* — Ziolkowski Patent Solutions Group, SC

(57) ABSTRACT

A reconfigured semiconductor logic device includes a semiconductor logic device comprising a plurality of input/output (I/O) pads formed on an active surface thereof and a redistribution layer. The redistribution layer comprises an insulating layer formed atop the active surface of the semiconductor logic device such that the insulating layer does not extend beyond an outer perimeter of the active surface and a patterned conductive wiring layer positioned above the insulating layer. The patterned conductive wiring layer includes a plurality of terminal buses formed on a top surface of the insulating layer. Each terminal bus of the plurality of terminal buses is electrically coupled to multiple I/O pads of the plurality of I/O pads through vias formed in the insulating layer.

29 Claims, 11 Drawing Sheets

(51) Int. Cl.

| | |
|---|---|
| ***H01L 21/56*** | (2006.01) |
| ***H01L 25/00*** | (2006.01) |
| ***H01L 25/10*** | (2006.01) |
| ***H01L 25/065*** | (2006.01) |
| ***H01L 23/50*** | (2006.01) |
| ***H01L 23/31*** | (2006.01) |

(52) U.S. Cl.

CPC .......... *H01L 23/50* (2013.01); *H01L 23/5286* (2013.01); *H01L 24/13* (2013.01); *H01L 24/19* (2013.01); *H01L 24/20* (2013.01); *H01L 24/24* (2013.01); *H01L 25/0655* (2013.01); *H01L 25/105* (2013.01); *H01L 25/50* (2013.01); *H01L 2224/0231* (2013.01); *H01L 2224/02379* (2013.01); *H01L 2224/0401* (2013.01); *H01L 2224/06131* (2013.01); *H01L 2224/13024* (2013.01); *H01L 2224/211* (2013.01); *H01L 2224/24137* (2013.01); *H01L 2225/1041* (2013.01); *H01L 2225/1058* (2013.01); *H01L 2924/1431* (2013.01); *H01L 2924/2064* (2013.01); *H01L 2924/20641* (2013.01); *H01L 2924/37001* (2013.01)

(58) Field of Classification Search

CPC . H01L 2224/06131; H01L 2224/13024; H01L 2224/0401; H01L 2224/0231; H01L 2224/02379; H01L 2224/211; H01L 2224/24137; H01L 2924/37001; H01L 2225/1058

USPC ........ 257/774, 773, 686, 685, 723, 777, 778

See application file for complete search history.

(56) References Cited

U.S. PATENT DOCUMENTS 5,774,340 A 6/1998 Chang et al.
5,841,193 A 11/1998 Eichelberger
5,888,837 A 3/1999 Fillion et al.
5,946,546 A 8/1999 Fillion et al.
6,008,534 A 12/1999 Fulcher
6,172,526 B1 1/2001 Iwasaki
6,242,282 B1 6/2001 Fillion et al.
7,514,767 B2 4/2009 Yang
7,662,667 B2 2/2010 Shen
7,674,655 B2 3/2010 Chua et al.
7,847,404 B1 12/2010 Schwegler et al.
7,932,744 B1 4/2011 Greene et al.
8,008,125 B2 8/2011 McConnelee et al.
8,093,722 B2 1/2012 Chen et al.
8,114,708 B2 2/2012 McConnelee et al.
8,163,596 B2 4/2012 Kapusta et al.
8,664,044 B2 3/2014 Jin et al.
8,754,514 B2 6/2014 Yu et al.
8,759,964 B2 6/2014 Pu et al.
8,779,601 B2 7/2014 Gan et al.
8,916,481 B2 12/2014 Gan et al.
8,927,412 B1 1/2015 Lin et al.
9,018,969 B2 4/2015 Ishikawa et al.
9,129,981 B2 8/2015 Yap et al.
9,281,286 B1 3/2016 Yap et al.
9,318,429 B2 4/2016 Hu et al.
9,432,298 B1 8/2016 Smith
9,520,372 B1 12/2016 Jeng et al.
9,543,224 B1 * 1/2017 Meyer ...................... H01L 22/20
9,548,240 B2 1/2017 Lin et al.
9,761,565 B2 9/2017 Vincent et al.
9,793,230 B1 10/2017 Yu et al.
9,837,359 B1 12/2017 Chiu et al.
9,972,536 B2 * 5/2018 Yoshida .................. H01L 21/82
2003/0049886 A1 3/2003 Salmon
2003/0209731 A1 11/2003 Ali et al.
2004/0092141 A1 5/2004 Salmon
2005/0156616 A1 7/2005 Morishita et al.
2006/0022353 A1 2/2006 Ajuria et al.
2006/0170093 A1 8/2006 Pendse
2006/0185895 A1 8/2006 Kalidas
2007/0075734 A1 * 4/2007 Ramos ................ G06F 15/7867 326/41
2008/0083936 A1 * 4/2008 Huynh ................ G06F 17/5072 257/203
2008/0096710 A1 * 4/2008 Souca ........................ F16G 5/18 474/245
2008/0104554 A1 5/2008 Kobayashi et al.
2008/0142071 A1 * 6/2008 Dorn .................... H05K 1/0293 136/245
2008/0237828 A1 10/2008 Yang
2009/0294938 A1 12/2009 Chen
2010/0025242 A1 * 2/2010 Pamula ............... B01F 13/0071 204/450
2010/0117228 A1 5/2010 Yamamichi et al.
2010/0127406 A1 5/2010 Higuchi
2011/0121445 A1 5/2011 Mori et al.
2012/0032314 A1 2/2012 Chen et al.
2012/0328235 A1 12/2012 Christensen et al.
2013/0040423 A1 2/2013 Tung et al.
2013/0127069 A1 5/2013 Boday et al.
2013/0139122 A1 * 5/2013 Pell ....................... G06F 17/505 716/117
2013/0161833 A1 6/2013 Pendse
2014/0110856 A1 4/2014 Lin
2014/0210068 A1 7/2014 Bartley et al.
2014/0374877 A1 * 12/2014 Oh ...................... H01L 23/5223 257/532
2016/0079205 A1 3/2016 Lin et al.
2016/0307872 A1 10/2016 Chen et al.
2017/0084596 A1 3/2017 Scanlan
2017/0092575 A1 3/2017 Manusharow et al.
2017/0116366 A1 * 4/2017 Seo ......................... H01L 28/00
2017/0141053 A1 * 5/2017 Chen ...................... H01L 21/565
2017/0373041 A1 * 12/2017 Kim .................... H01L 25/0657
2018/0130732 A1 5/2018 Tuominen et al.
2018/0130747 A1 5/2018 Tuominen et al.
2018/0218983 A1 * 8/2018 Chen ....................... H01L 24/20

OTHER PUBLICATIONS

Shen et al., "Design of On-Chip Microwave Filters in Integrated Fan-Out Wafer Level Packaging (InFO-WLP Technology", National Taiwan University, Tiawan, APEMC Conference 2015 IEEE, pp. 1-3.

* cited by examiner

SEMICONDUCTOR LOGIC DEVICE AND SYSTEM AND METHOD OF EMBEDDED PACKAGING OF SAME

BACKGROUND OF THE INVENTION

Embodiments of the invention relate generally to semiconductor logic devices and structures and methods for packaging semiconductor logic devices within embedded chip packages.

High performance, high pin count semiconductor logic devices or chips have hundreds or thousands of input/output ("I/O") pads for signals, power, and ground. FIG. 1 depicts an exemplary prior art semiconductor logic device 10 with signal I/O pads 12, power I/O pads 14, and ground I/O pads 16 arranged for flip chip solder bump attach. As shown, I/O pads 12, 14, 16 have the same pad size or diameter and are arranged in a uniform array on a grid of uniform x-axis pitch and y-axis pitch distributed over the whole surface of the device 10. A skilled artisan will recognize that a typical complex semiconductor logic device such as a microprocessor, applications processor, or graphics processor would have many more I/O pads than illustrated in FIG. 1. As such, semiconductor logic device 10 is depicted with break lines to represent portions of the semiconductor logic device 10 that have been omitted for clarity purposes.

Semiconductor logic devices such as device 10 are generally mounted to a board, substrate, or interconnect structure 18 by flip chip attach to form a flip chip package 20 as shown in FIG. 2. Solder bumps 22 are attached to each I/O pad 12, 14, 16 and reflowed to attach the device 10 to the upper pads 24 of the multi-layer interconnect structure 18. Interconnect structure 18 has multiple interconnect layers 26, each comprising an insulating layer 28, a wiring layer 30, and metallized vias 32 formed through the insulating layer 28. An underfill resin 34 lies between semiconductor logic device 10 and interconnect structure 18 and encapsulates the solder bumps 22 to control coefficient of thermal expansion (CTE) induced solder fatigue. The interconnect layers 26 electrically couple I/O pads 12, 14, 16 to the lower I/O terminals 36 of the multi-layer interconnect structure 18. Solder balls 38 are attached to the lower I/O terminals 36 and are used to interconnect the interconnect structure 18 to an external structure (not shown) such as a mother board.

Typically, high-end semiconductor logic chips have 70 to 85 percent of all I/O pads dedicated to power and ground due to high power/ground current levels in these devices and performance limitations of the solder bumps. Solder bumps have high resistance losses due to their low electrically conductivity and current limitations due to electro-migration susceptibility. This need for high numbers of power and ground I/O pads can force chip designers to increase the size of a high-end chip to a size larger than the design's gate count requires. Larger chips result in fewer chips per wafer and lower wafer level chip yields, which increases the cost of the chip.

For the past five decades, semiconductor processing has evolved to ever smaller minimum feature sizes—from tens of microns fifty years ago to ten to fifteen nanometers today. Smaller feature sizes allow semiconductor designers to design chips with small elements and permit more semiconductor elements, transistors, or gates per unit area, therefore providing more functionally per chip. This semiconductor evolution trend has generally been done in discrete steps defined by the minimum allowable feature size and are called semiconductor wafer fab nodes or semiconductor technology nodes. The 14-nanometer node is now in wide spread production with some high-end devices moving into the 10-nanometer node. These node shrinks are driven by the desire to add more gates or functionality per chip without increasing the physical size of the chip. Moving semiconductor logic device 10 from one semiconductor technology node onto another node with smaller minimum features allows the device to be shrunk to a smaller size, resulting in more devices per wafer and lower device fabrication costs. Redesigning a complex semiconductor logic device designed for fabrication on a 14-nanometer node line for fabrication on a 10-nanometer node line, for example, potentially provides a nearly 50% die size shrink. A move to an even smaller feature size semiconductor node could shrink the device even further.

Despite the ever-evolving push for device miniaturization, many flip chip devices with high I/O pad counts cannot reduce the die size when moving to a smaller feature node because of the minimum pitch allowable on solder bumped flip chip devices. The minimum pad pitch that can be flip chip solder bump attached with a sufficiently high assemble yield is referred to hereafter as the "minimum solderable pitch" and ranges from about 120 microns to about 160 microns depending on a particular assembly houses' individual assembly processes, materials, and capabilities. Flip chip devices with a full array of I/O pads on the minimum solderable pitch have a size that is pad count limited. Thus, reducing the size of semiconductor logic device 10 would require either reduction in the number of power and ground I/O pads, which would lower power and ground conductivity and device performance, or a reduction in the array grid pitch.

Reducing the array grid pitch is particularly problematic in flip chip solder ball attach. In the simplified pad configuration depicted in FIG. 1 for example, the I/O pads 12, 14, 16 are on the minimum solderable pitch. Example A of device 10 is a 900 I/O pad device with a full 30 by 30 array of I/O pads on a 150 micron pitch grid, with a die size of 4.5 mm×4.5 mm. In this example, there are 116 perimeter I/O signal pads all located on the outer row of the 30 by 30 array of pads. Device 10 also has 392 I/O power pads and 392 I/O ground pads all located in the inner rows of the array. A device with an array grid pitch of 150 microns would typically have 60-70 micron diameter I/O pads and an 80-90 micron solder bump diameter. A tighter grid pitch would require smaller I/O pads, smaller solder bumps, and would have lower bump conductivity, higher assembly costs, higher risk of bump-to-bump shorting, and lower solder fatigue compliance. As a result, designers may move a flip chip device that is pad count limited to a smaller semiconductor node to get improved device performance but the die size could not be shrunk without lower assembly yield, lower device reliability and increased costs.

One known technique for reducing pitch below the minimum solderable pitch is to replace the flip chip solder bumps 22 (FIG. 2) with copper pillars formed on the I/O pads 12, 14, 16 of semiconductor logic device 10. A thin layer of solder layer would be applied at the end of the copper pillars, often as a paste, and reflowed to couple the semiconductor logic device 10 to the interconnect structure 18. While copper pillars can be used on a tighter pitch than the minimum solderable pitch without causing a pad-to-pad short, shrinking the pitch of a copper pillar/solder layer flip chip attach structure increases the risk of electro-migration failures.

Another approach to addressing the performance limitations of flip chip and copper pillar interconnections is to embed logic devices into an organic substrate and form a build-up structure over the chip. U.S. Pat. No. 8,163,596 discloses an embedded chip module that bonds a semiconductor chip under an organic interconnect structure and encapsulates the chip in an organic molding material. The interconnect structure fans out the I/O pads of the chip to the perimeter region outside of the chip forming a fan-out wafer level device. U.S. Pat. No. 5,946,546 applies an organic interconnect structure of the surface of a semiconductor chip and fans in the chip I/O pads from the perimeter of the chip to an array of pads above the surface of the chip in order to convert a chip designed for wire bond assembly into a device with an area array of I/O terminals configured for flip chip solder bump assembly. The resulting reconfigured device could be flip chip attached onto a board, substrate or package, eliminating wire bonds.

One key problem with utilizing embedded chip packaging is that the interconnect structure built over the chip has a yield loss due to interconnect fabrication defects such as shorts and opens. A defect in the interconnect structure that is formed after a chip is embedded in the structure would cause the chip to be scrapped along with the defective interconnect structure. Yield losses are low (1-2%) in embedded chip packages that incorporate non-complex, low I/O count chips. Complex semiconductor logic devices with high numbers of I/O pads, on the other hand, require complex interconnect structures with unacceptable yield losses of 20% or higher. A 20% embedded chip yield loss would cause 20% of the complex chips to be scrapped with the defective interconnect structures in which they are embedded. For these reasons, the implementation of embedded chip technologies to complex semiconductor logic devices has been restricted and has not been done in high volume manufacturing.

Accordingly, there is a need for a miniaturized semiconductor logic device that addresses the above limitations and can be packaged using embedded chip technologies with low interconnect yields.

BRIEF DESCRIPTION OF THE INVENTION

In accordance with one aspect of the invention, a reconfigured semiconductor logic device includes a semiconductor logic device comprising a plurality of input/output (I/O) pads formed on an active surface thereof and a redistribution layer. The redistribution layer comprises an insulating layer formed atop the active surface of the semiconductor logic device such that the insulating layer does not extend beyond an outer perimeter of the active surface and a patterned conductive wiring layer positioned above the insulating layer. The patterned conductive wiring layer includes a plurality of terminal buses formed on a top surface of the insulating layer. Each terminal bus of the plurality of terminal buses is electrically coupled to multiple I/O pads of the plurality of I/O pads through vias formed in the insulating layer.

In accordance with another aspect of the invention, a method of manufacturing a reconfigured semiconductor logic device includes disposing an insulating layer over an active surface of a semiconductor logic device and forming a plurality of vias through a thickness of the insulating layer to expose a plurality of input/output (I/O) pads located on the active surface of the semiconductor logic device. The method also includes forming at least one patterned conductive layer above a top surface the insulating layer and into the plurality of vias, the at least one patterned conductive layer comprising at least one terminal bus that is electrically coupled to multiple I/O pads of the plurality of I/O pads through multiple vias of the plurality of vias.

In accordance with another aspect of the invention, an embedded electronics package includes an insulating material and a reconfigured semiconductor device at least partially embedded within the insulating material. The reconfigured semiconductor device includes a semiconductor device having an active surface with a plurality of input/output (I/O) pads arranged thereon and a redistribution layer. The redistribution layer comprises an insulating layer having a first surface disposed on the active surface of the semiconductor device and a conductive wiring layer comprising at least one bus bar formed on a second surface of the insulating layer. Each of the at least one bus bar is electrically coupled to at least two of the plurality of I/O pads through the insulating layer. A multi-layer interconnect structure is formed over the insulating material and the reconfigured semiconductor device. The multi-layer interconnect structure is electrically coupled to the semiconductor device by way of the conductive wiring layer.

In accordance with yet another aspect of the invention, a method of forming an embedded electronics package includes embedding a reconfigured semiconductor device within an insulating material such that a top surface of the reconfigured semiconductor device and a top surface of the insulating material are co-planar or substantially co-planar, the reconfigured semiconductor device comprising a semiconductor device and at least one bus bar that electrically couples the top surface of the reconfigured semiconductor device to a plurality of I/O pads located on an active surface of the semiconductor device through an insulating layer formed on the active surface. The method further includes forming an overlay interconnect structure over the top surface of the insulating material and the top surface of the reconfigured semiconductor device. The overlay interconnect structure comprises at least one conductive wiring layer electrically coupled to the plurality of I/O pads through the at least one bus bar.

These and other advantages and features will be more readily understood from the following detailed description of preferred embodiments of the invention that is provided in connection with the accompanying drawings.

BRIEF DESCRIPTION OF THE DRAWINGS

The drawings illustrate embodiments presently contemplated for carrying out the invention.

In the drawings.

DETAILED DESCRIPTION

Embodiments of the present invention provide for semiconductor logic devices provided with a reconfiguration layer that includes bussed connections to power and ground input/output (I/O) pads and enables improved electrical performance, improved packaging yields, and reduced chip costs. The bussed power and ground terminals provide the capability to shrink the overall size of the semiconductor logic device while maintaining or improving power and ground signal delivery. Interconnect packaging structures are also disclosed herein that provide for an embedded chip module that incorporates these reconfigured and improved semiconductor logic devices with acceptable yield losses.

As used herein, the term "semiconductor logic device" refers to a semiconductor component, integrated circuit, device, die or chip that processes digital data in order to control the operation of electronic systems. Semiconductor logic devices are constructed from small electronic circuits called logic gates that can be used to create combinational logic. Semiconductor logic devices are formed using semiconductor elements and perform specific functions such as a microprocessor, memory device, imaging or video processing circuit, controller, digital signal processor (DSP), Application Specific Integrated Circuit (ASIC), or microcontroller, as non-limiting examples. High performance semiconductor logic devices are high pin count devices, meaning that they have hundreds or thousands of I/O interconnection terminals for signals, power, and ground. These I/O interconnections are referred to herein as I/O pads, are used to connect the semiconductor logic device to external circuitry, and are electrically coupled to internal elements within the semiconductor logic device.

While the various embodiments of electronics packages referenced below are shown and described as including a particular arrangement of a semiconductor logic device, interconnection wiring, and electronic package terminals, it is understood that alternative arrangements and configurations could also be implemented and thus embodiments of the invention are not limited only to the specifically illustrated devices and arrangements thereof. That is, the electronics package embodiments described below should also be understood to encompass electronic packages that might include additional electronic components and/or one or more alternative device types of semiconductor logic devices than those listed above. The electronics packages described herein may also include one or more resistors, capacitors, inductors, filters and similar devices and combinations thereof. As used herein the term "electrical component" may be understood to encompass any of the various types of semiconductor logic devices described above as well as resistors, capacitors, inductors, filters and similar passive devices, and other types of semiconductor devices.

Figure 3:
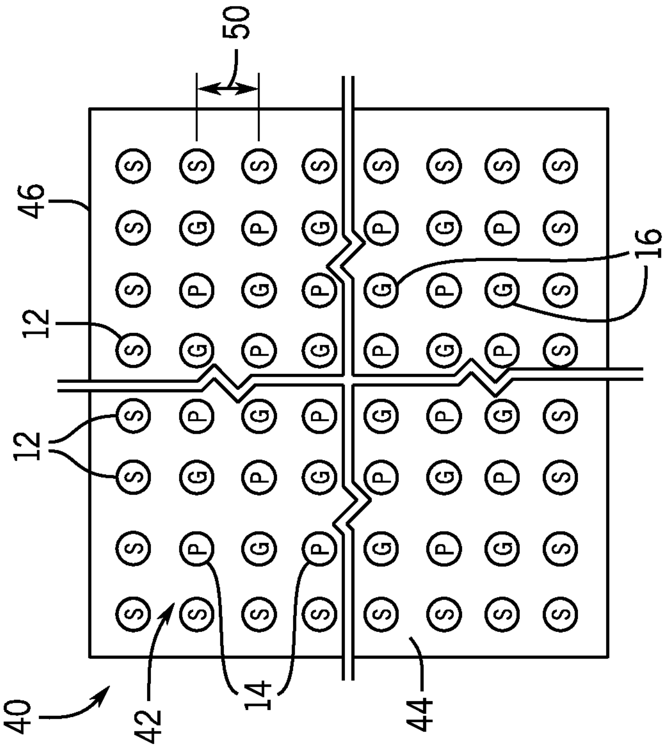
FIG. 3 is a schematic top view of a semiconductor logic device, according to an embodiment of the invention.

Referring now to FIG. 3, a semiconductor device 40 is disclosed according to an embodiment of the invention. Semiconductor device 40 is depicted with break lines representing portions of the area array omitted for clarity purposes. Similar to semiconductor logic device 10 of FIG. 1, semiconductor device 40 includes an area array of signal, power, and ground I/O pads 12, 14, 16 formed on the topside or active surface 42 of the semiconductor base substrate 44 of the semiconductor device 40. I/O pads 12, 14, 16 may have a composition that includes a variety of electrically conductive materials such as aluminum, copper, gold, silver, nickel, or combinations thereof as non-limiting examples.

I/O pads 12, 14, 16 provide conductive routes (I/O connections) to internal contacts such as transistors or logic gates formed within an internal contact region 43 (FIG. 6) of the semiconductor base substrate 44 proximate the active surface 42 of the semiconductor device 40. According to various embodiments, semiconductor device 40 is a semiconductor logic device that may include hundreds of thousands, if not millions of internal contacts. These internal contacts are omitted from FIG. 6 for purposes of clarity and in light of the scale mismatch relative to the illustrated components. It is contemplated that the internal contacts of semiconductor logic device 40 may be constructed according to known techniques.

Figure 1:
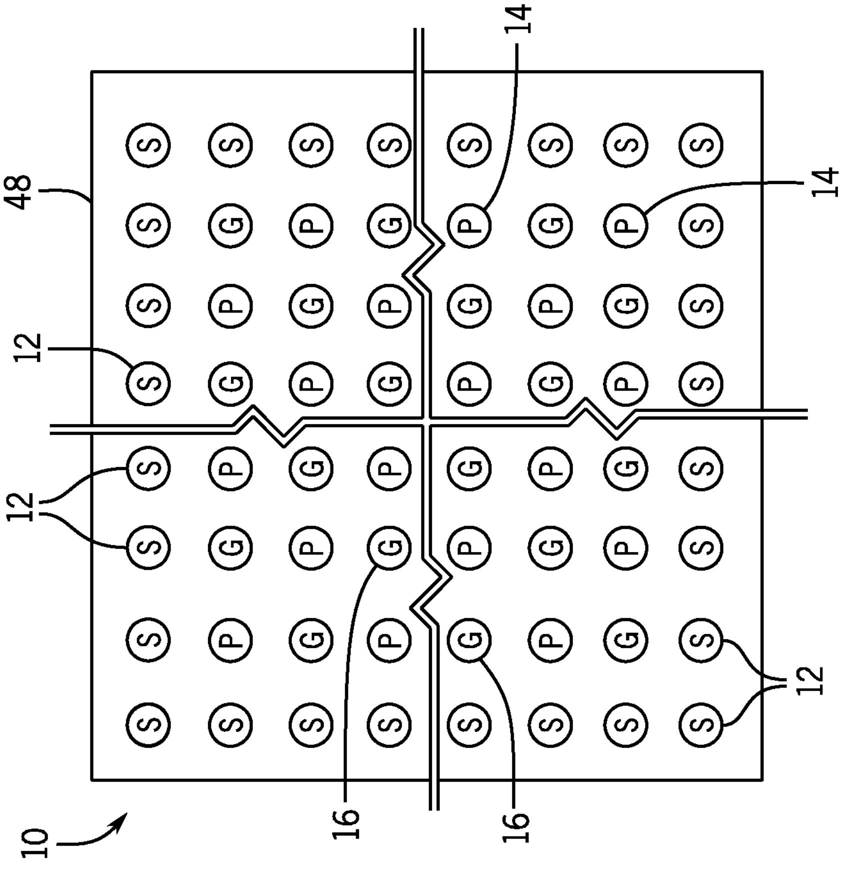
FIG. 1 is a schematic cross-sectional view of an exemplary, prior art semiconductor logic device.
Figure 2:
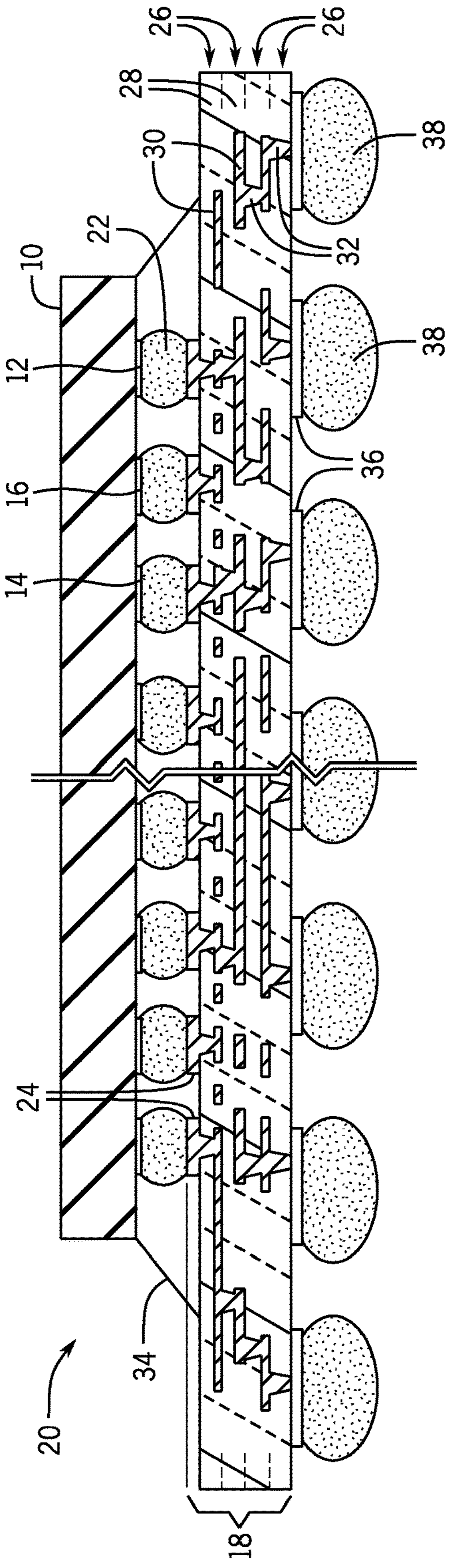
FIG. 2 is a schematic cross-sectional view of an exemplary prior art flip chip electronic package.

Semiconductor logic device 40 retains the same internal device functions as the semiconductor logic device 10 of FIG. 1 but with a feature size reduction that results in an overall die shrink (i.e., a smaller outer perimeter 46) as compared to perimeter 48 of semiconductor logic device 10. In the embodiment illustrated in FIG. 3, this feature size reduction is accomplished by reducing the pad pitch of the signal, power, and ground I/O pads 12, 14, 16 while maintaining the same number of signal, power, and ground I/O pads 12, 14, 16 as the larger semiconductor logic device 10. As shown in FIG. 3, I/O pads 12, 14, 16 are arranged in an area array of I/O pads that is formed as a grid with uniform x-axis and y-axis pitch distributed over the whole active surface 42 of the device 40. As used herein, the term "pitch" refers to the center-to-center distance between adjacent I/O pads. In some embodiments, the size (i.e., surface area) of the I/O pads 12, 14, 16 is also reduced as compared to semiconductor logic device 10. In such case, the overall die shrink of semiconductor logic device 40 is accomplished by reducing all of the device features of the original semiconductor logic device 10 by the same percent reduction, thereby avoiding the need to re-layout I/O gate to I/O pad routing and other internal features of the semiconductor logic device 10 located within internal contact region 43.

An exemplary embodiment of semiconductor logic device 40 of FIG. 3 is described herein as Example A' to highlight distinctions between the previously described prior art construction of device 10 and embodiments of the present invention. However, the overall array arrangement and number of signal, power, and ground I/O pads 12, 14, 16 of device 40 may be varied based on particular design specifications in alternative embodiments. In Example A', semiconductor logic device 40 is a die shrunk version of the Example A configuration of device 10. The die size has been shrunk from 4.5 mm by 4.5 mm to 3.95 mm by 3.95 mm, about a 23% die shrink based upon a feature size reduction of about 12.5%. Device 40 has the same number of signal, power, and ground I/O pads as device 10 of Example A—116, 392, and 392 respectively—which are arranged on a reduced pad pitch of 130 microns.

Figure 4:
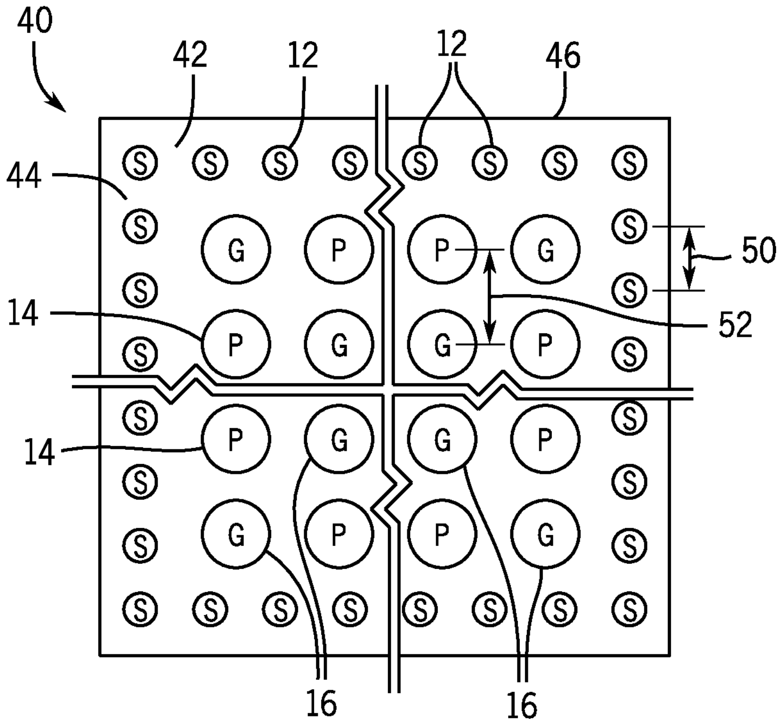
FIG. 4 is a schematic top view of a semiconductor logic device, according to another embodiment of the invention.

In alternative embodiments the feature size reduction may be accomplished by reducing the number of power and ground I/O pads 14, 16 and, optionally, also by reducing the pad pitch of the signal I/O pads 12. An exemplary semiconductor logic device 40 with I/O pads 12, 14, 16 configured in this manner is illustrated in FIG. 4. As shown, signal I/O pads 12 of semiconductor logic device 40 are located in an exterior region adjacent perimeter 46 of the device 40 and arranged in the outer rows of the array that surround the area array of power and ground I/O pads 14, 16 that are located in the central region of device 40. Semiconductor logic device 40 includes a reduced number of power I/O pads 14 and ground I/O pads 16 located in an interior region of the semiconductor logic device 40. Power and ground I/O pads 14, 16 have a larger surface area and a larger pitch 52 as compared to device 10 (FIG. 1). In some embodiments, the individual signal I/O pads 12 of semiconductor logic device 40 have a smaller surface area (e.g., have a smaller diameter) than power and ground I/O pads 14, 16.

An exemplary embodiment of semiconductor logic device 40 of FIG. 4 is described herein as Example A" to highlight distinctions between the previously described prior art construction of device 10 and embodiments of the present invention. In Example A", semiconductor logic device 40 is a die shrunk version of the device 10 from Example A according to one embodiment of this invention. The die size has been shrunk from 4.5 mm by 4.5 mm to 3.9 mm by 3.9 mm, about a 25% die shrink based upon a feature size reduction of about 13%. It has the same number of signal I/O pads (116) as device 10 of Example A on a reduced pad pitch of 130 microns. It has an array of 20 by 20 I/O power and I/O ground pads formed in the center of the device on a larger pitch, 180 microns. Whereas non-shrunk device 10 of Example A had 392 I/O power pads and 392 I/O ground pads, shrunk device 40 of Example A" has 200 I/O power pads and 200 I/O ground pads.

In the embodiment illustrated in FIG. 4, signal I/O pads 12 are arranged on a smaller pitch 50 than the minimum solderable pitch of device 10. In the embodiment illustrated in FIG. 3 all of the I/O pads 12, 14, 16 of semiconductor logic device 40 are arranged on a smaller or tighter pitch 50 than the minimum solderable pitch of device 10. In other words, I/O pads 12, 14, 16 are formed at a non-solderable pitch or a pitch less than a minimum pitch for solder bump attachment. In one exemplary and non-limiting embodiment pitch 50 is 130 microns. In other embodiments, pitch 50 may be in the range of 80 to 100 microns. Therefore, the semiconductor logic devices 40 illustrated in FIGS. 3 and 4 are not compatible with flip chip solder assembly.

Figure 5:
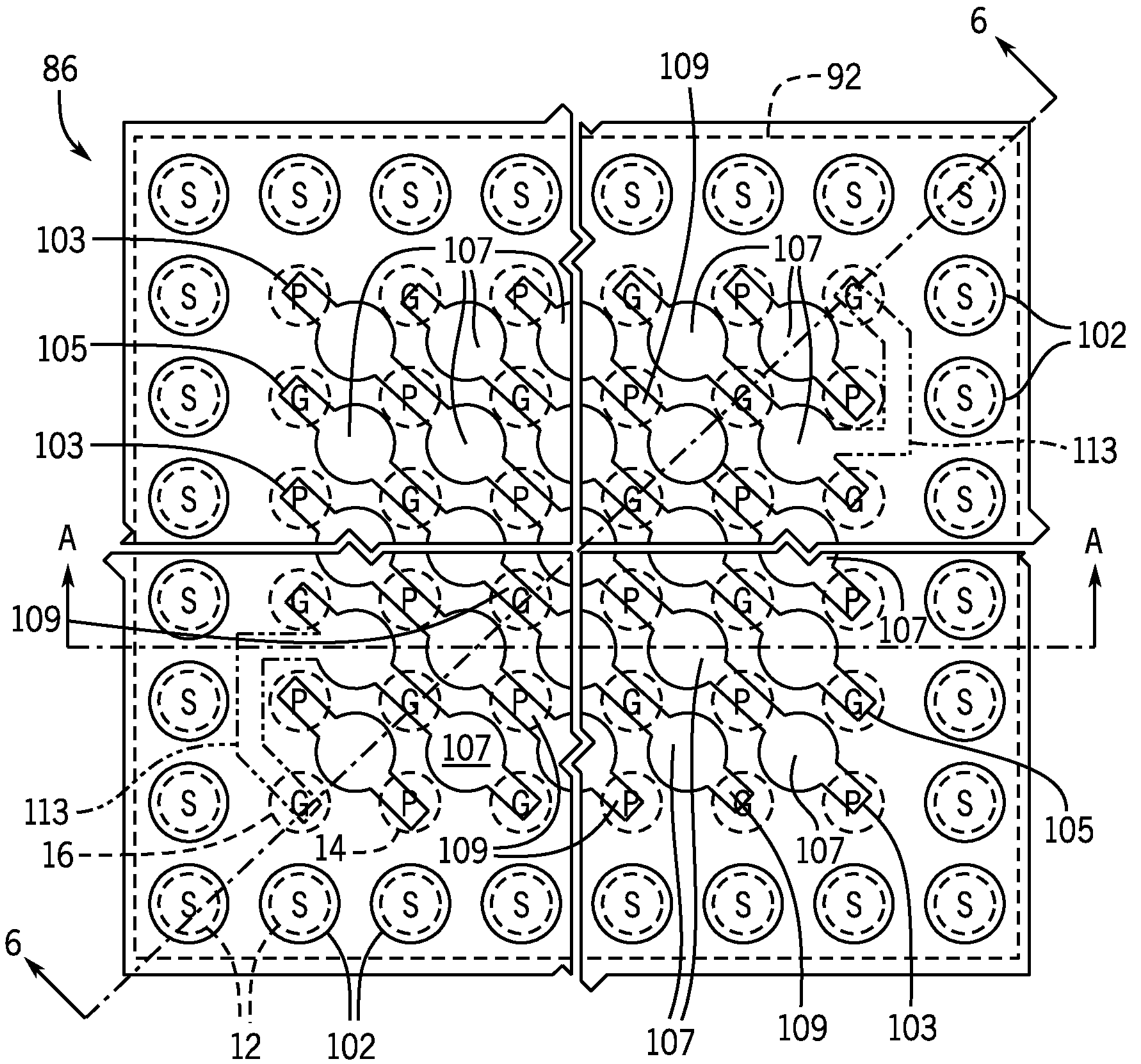
FIG. 5 is a schematic top view of a portion of a wafer-level reconfigured semiconductor logic structure including a redistribution layer, according to an embodiment of the invention.

In order to optimize semiconductor logic device 40 for insertion into an embedded chip package, a reconfiguration or redistribution layer is formed over the semiconductor logic device 40 at the wafer level (i.e., before singulation). FIG. 5 depicts a portion of a wafer-level reconfigured semiconductor logic structure 86, according to an embodiment of the invention. Reconfigured semiconductor logic structure 86 is formed by applying at least one on-wafer redistribution layer 88 on a completed semiconductor wafer 90 that includes a number of die sites 92. In the illustrated embodiment, I/O pads 12, 14, 16 are arranged in a similar manner as the semiconductor logic device 40 of FIG. 3. However, it is to be understood that on-wafer redistribution layer 88 may be utilized in a similar manner with a semiconductor wafer fabricated with die sites that include an area array of I/O pads 12, 14, 16 similar to that depicted in FIG. 4 or in any alternative arrangement with the size, pitch, and number of I/O pads 12, 14, 16 determined based on particular design specifications. While described as being formed at the wafer level, it is contemplated that the techniques described herein for fabricating redistribution layer 88 can be extended to forming one or more redistribution layers at the die level on singulated semiconductor logic devices or other types of electrical components.

Figure 6:
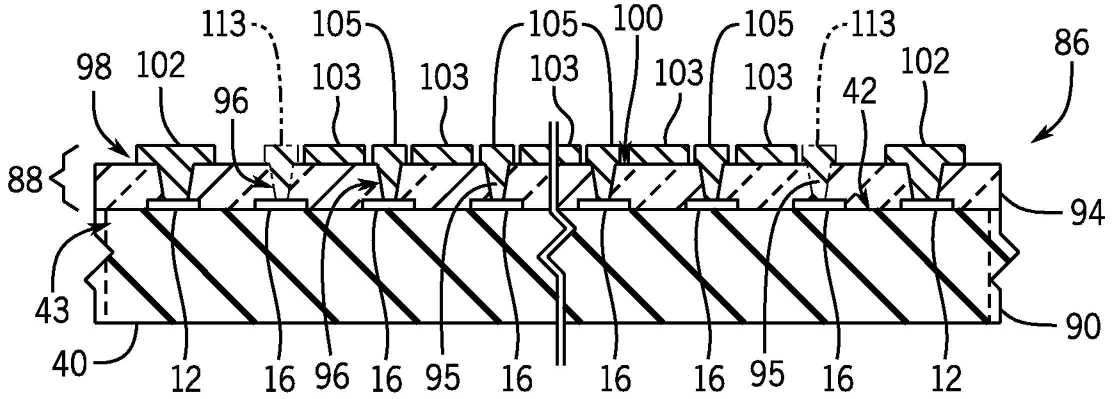
FIG. 6 is a schematic cross-sectional view of a portion of the wafer-level reconfigured semiconductor logic structure of FIG. 5, according to an embodiment of the invention.

As shown in the cross-sectional view provided in FIG. 6, on-wafer redistribution layer 88 is formed on the active surface 42 of wafer 90. In the illustrated embodiment, on-wafer redistribution layer 88 includes an insulating layer 94, a patterned conductive wiring layer or terminal pad and bus layer 98, and conductive vias 95 formed through the insulating layer 94. In other embodiments additional redistribution layers may be formed between redistribution layer 88 and semiconductor logic device 40 to achieve a desired routing pattern to I/O pads 12, 14, 16.

Insulating layer 94 is preferably an organic resin such as, for example, a polyimide, Ultem®, bismaleimide-triazine (BT) resin, liquid crystal polymer, benzocyclobutane (BCB), polyetherimide, epoxy, epoxy-glass or the like. However, it is contemplated that insulating layer 94 may be provided in the form of another suitable electrically insulating material, insulating film or dielectric substrate, such as for example a Kapton® laminate flex, polytetrafluoroethylene (PTFE), or another polymer film, such as a liquid crystal polymer (LCP), or inorganic films such as ceramic or glass, as non-limiting examples. Alternatively, insulating layer 94 may be provided as an organic film provided with an adhesive layer, a self-bonding film, such as, for example, an epoxy-fiber glass pre-preg, or a liquid dispensed dielectric that is cured in place.

Terminal pad and bus layer 98 is preferably a patterned metal layer such as aluminum, copper, gold, silver, nickel, or combinations thereof as non-limiting examples. However, other electrically conducting materials or a combination of metal and a filling agent may be used in other embodiments. Terminal pad and bus layer 98 is formed atop the outer surface 100 of the insulating layer 94 and extends into vias 96 and onto exposed portions of I/O pads 12, 14, 16, forming electrical connections between terminal pad and bus layer 98 and I/O pads 12, 14, 16.

As shown in FIG. 5, terminal pad and bus layer 98 is a patterned conductive layer that includes discrete signal terminal pads 102 aligned above respective signal I/O pads 12. In an alternative embodiment, terminal pads 102 may be offset from the underlying signal I/O pads 12. While terminal pads 102 are illustrated in FIG. 5 with a substantially circular geometry, it is contemplated that terminal pads 102 may be formed as rectangular elements or with any alternative geometrical configuration. Terminal pad and bus layer 98 also includes a number of bus bars or terminal buses 103, 105. The power terminal buses 103 or power bus bars are formed over adjacent power I/O pads 14. Likewise, the ground terminal buses 105 or ground bus bars are formed over adjacent ground I/O pads 16. As shown, the power and ground terminal buses 103, 105 are composed of bus pads 107 and interconnecting traces 109. The power and ground terminal buses 103, 105 that form bused connections to three or more underlying I/O pads 14, 16 include a series of bus pads 107 that are electrically coupled together by way of interconnecting traces 109 that extend between adjacent bus pads 107 in the series of bus pads 107.

Figure 12:
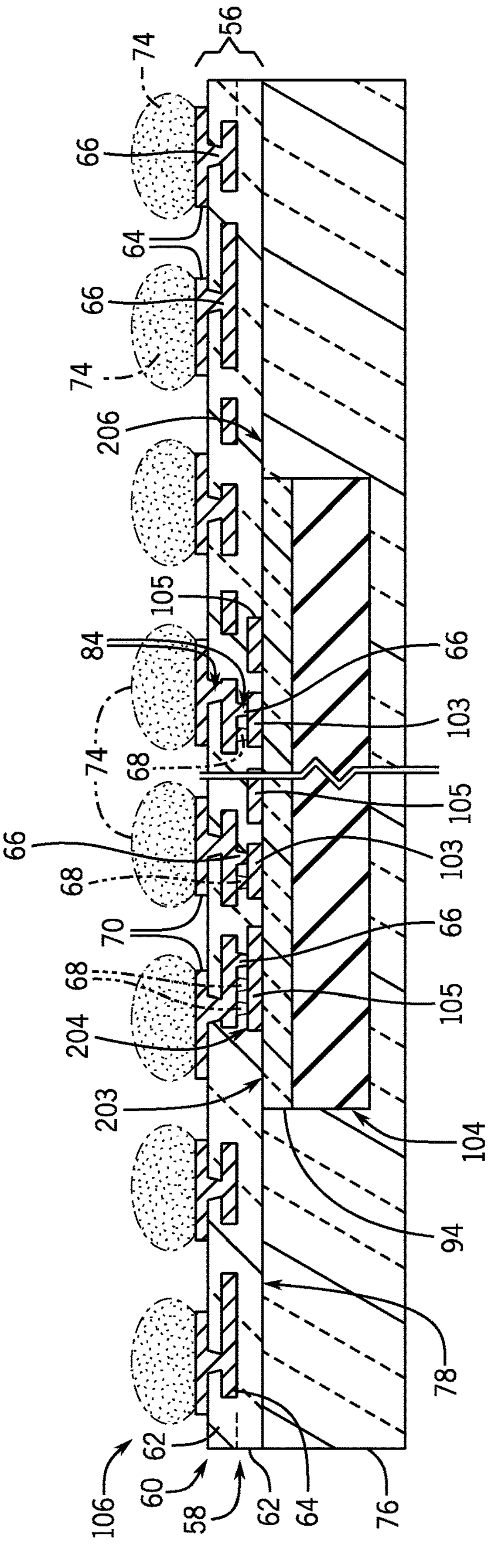
FIG. 12 is a schematic cross-sectional view of an electronic package including a reconfigured semiconductor logic device, according to an embodiment of the invention.

In the illustrated embodiment bus pads 107 are offset from the underlying power and ground I/O pads 14, 16 and are formed larger (i.e., with a larger surface area) than the power and ground I/O pads 14, 16 to facilitate forming multiple parallel via connections to the terminal buses 103, 105 during the embedded chip process, as described in more detail with respect to FIG. 12. Interconnecting traces 109 electrically connect to respective power and ground I/O pads 14, 16 through the conductive vias 95. In alternative embodiments bus pads 107 may be aligned over underlying power and ground I/O pads 14, 16 with interconnecting traces 109 positioned between adjacent bus pads 107. The power terminal buses 103 and ground terminal buses 105 lower the connection resistance between interconnect rerouting layers and the device I/O pads 14, 16 when the reconfigured device 104 is incorporated into an embedded chip package, such as the embedded chip package 106 of FIG. 12.

Figure 7:
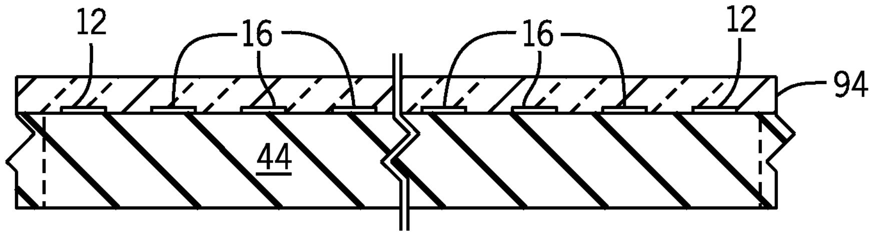
FIGS. 7-9 are schematic cross-sectional views of a portion of a wafer-level reconfigured semiconductor logic structure during various stages of a manufacturing process, according to an embodiment of the invention.
Figure 8:
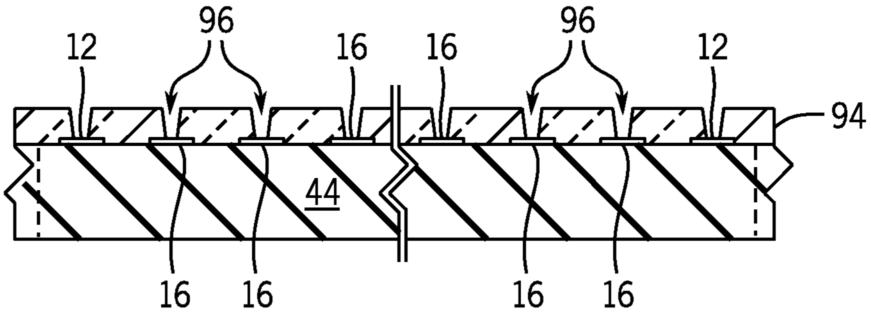
Figure 9:
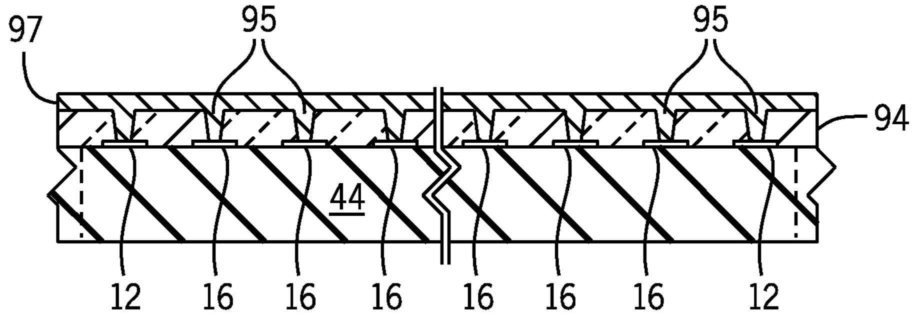

Referring now to FIGS. 7-9, select steps of a technique for manufacturing the on-wafer redistribution layer 88 are set forth, according to one embodiment of the invention, with each figure illustrating a cross-section of the on-wafer redistribution layer 88 and underlying wafer 90 during the build-up process. While FIGS. 7-9 illustrate the manufacture of redistribution layer 88 at the wafer level, it is contemplated that a similar redistribution layer may be formed on a singulated semiconductor logic device, such as device 40 of FIG. 3 or 4, or other types of discrete electrical components.

Referring first to FIG. 7, fabrication of on-wafer redistribution layer 88 begins by dispensing insulating layer 94 on the active surface 42 of the wafer 90. Insulating layer 94 may be applied by any known technique such as, for example, spin coating, spray coating, evaporation, or meniscus coating. After insulating layer 94 is cured, vias 96 are formed through insulating layer 94 to the I/O pads 12, 14, 16 of semiconductor logic device 40, as shown in FIG. 8. Vias 96 may be fabricated using known techniques such as, for example, laser ablation, plasma etch, chemical etch, or a combination of such. In some embodiments, vias 96 may be formed with a diameter of 10-50 microns. However, the dimensions of vias 96 may fall outside of this range in alternative embodiments. Optionally, the vias 96 formed to the larger power and ground I/O pads 14, 16 may have a larger diameter than those formed to the smaller signal pads 12 to enable higher current capability and lower interconnect resistance for the electrical connections formed to power and ground I/O pads 14, 16. In one embodiment, vias 96 are formed having angled side surfaces, as shown in FIG. 8, to facilitate later filling and metal deposition. Alternatively, vias 96 may be straight-sided. Vias 96 are subsequently cleaned such as through a reactive ion etching (RIE) desoot process or laser process.

The manufacturing technique continues by plating a conductor layer 97 or metallization layer directly on insulating layer 94. According to alternative embodiments, the conductive layer 97 contains a bulk metal such as copper, aluminum, or other standard wiring metal and may contain a barrier or adhesion metal such as titanium or chromium and is deposited by one or more of sputtering, evaporation, electroless plating, electroplating, or other standard metal deposition processes. Alternatively, the conductive layer 97 is formed from an electrically conductive polymer or inks that contain conductive metal particles. The conductor layer 97 extends through vias 96 thereby forming conductive vias 95 that electrically couple with I/O pads 12, 14, 16. The terminal pad and bus layer 98 shown in FIGS. 4 and 5 is then formed by selectively removing portions of conductive layer 97 using known patterning techniques. In other embodiments, the terminal pad and bus layer 98 may be formed using any known patterning techniques such as, for example, fully subtractive patterning, semi-additive pattern plate-up, or additive plate-up. In yet other embodiments, the patterned conductive layer 98 is a printed conductive material formed using a deposition technique such as inkjet printing, screen printing, or dispensing, as non-limiting examples.

While the wafer-level reconfigured semiconductor logic structure 86 is disclosed herein as including a single on-wafer redistribution layer 88, it is contemplated that one or more additional redistribution layers may be formed atop redistribution layer 88 in alternative embodiments to achieve a desired reconfigured pattern of I/O connections to signal, power, and ground I/O pads 12, 14, 16. In such an embodiment, the topmost redistribution layer would be configured with a conductive wiring layer similar to terminal pad and bus layer 98 and any intermediate reconfiguration layer(s) would include conductive wiring layer(s) patterned to route electrical connections from the underlying I/O pads 12, 14, 16 to the terminal pad and bus layer 98. Once the reconfiguration layer(s) 88 is/are complete the wafer-level reconfigured semiconductor logic structure 86 may be singulated into individual reconfigured semiconductor logic devices. In a singulated reconfigured semiconductor logic device, the overall footprint of the reconfiguration layer(s) 88 is equal to that of the underlying semiconductor logic device 40. As such, the insulating layer 94 and terminal pad and bus layer 98 do not extend beyond the outer perimeter 46 of the underlying semiconductor logic device 40.

Figure 10:
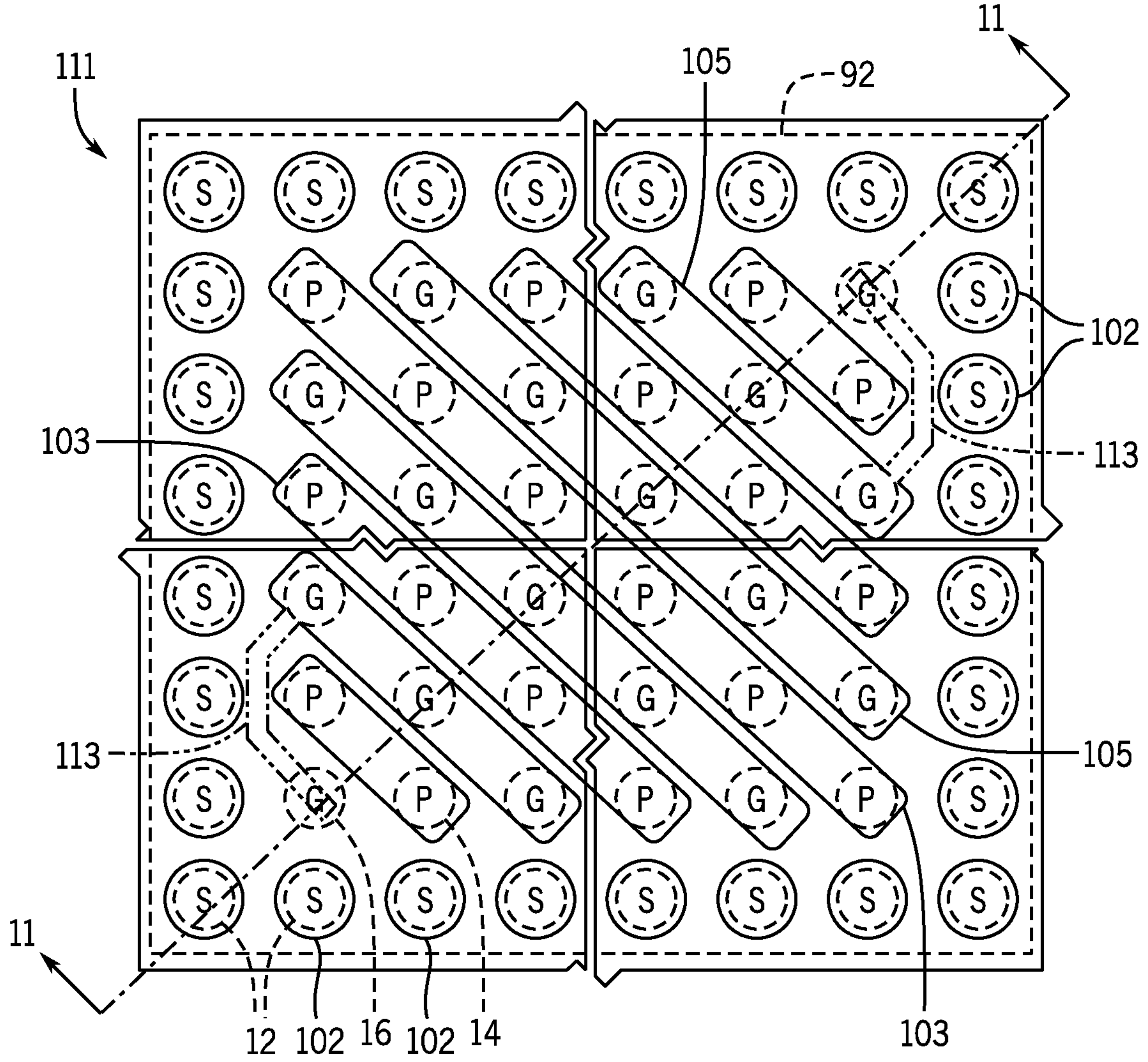
FIG. 10 is a schematic top view of a portion of a wafer-level reconfigured semiconductor logic structure including a redistribution layer, according to another embodiment of the invention.
Figure 11:
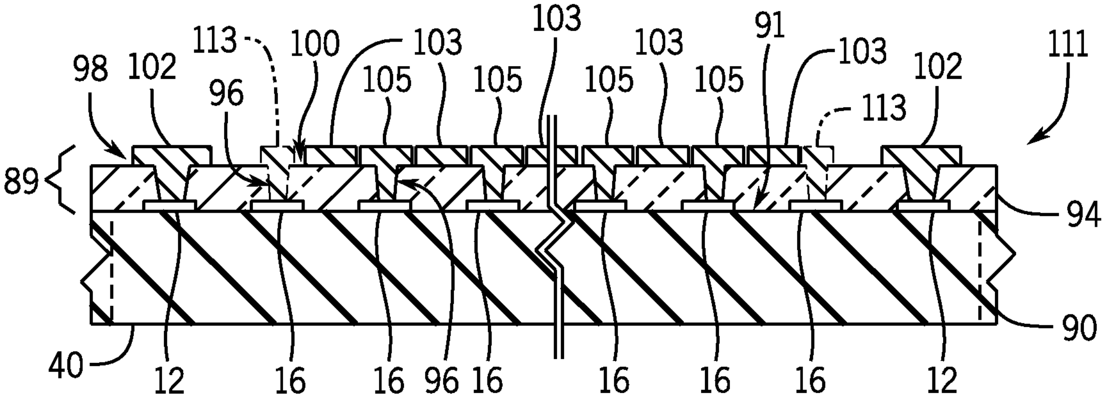
FIG. 11 is a schematic cross-sectional view a portion of the wafer-level reconfigured semiconductor logic structure of FIG. 10, according to an embodiment of the invention.

FIG. 10 depicts a wafer-level reconfigured semiconductor logic structure 111 according to another embodiment of the invention. Reconfigured semiconductor logic structure 111 includes a number of components similar to those of structure 86 (FIGS. 8 and 9), which are referred to with common reference numbers. As with structure 86 of FIGS. 8 and 9, the redistribution layer 89 of the wafer-level reconfigured semiconductor logic structure 111 in FIG. 10 is depicted relative to an I/O pad configuration similar to device 40 of FIG. 3. However, it is to be understood that the redistribution layer 89 may be modified for use with alternative I/O pad configurations, such as, for example, that illustrated in FIG. 4 or with other types of electrical components. Redistribution layer 89 includes a terminal pad and bus layer 98 that is patterned to include discrete terminal pads 102 aligned with respective signal I/O pads 12 and a number of power terminal buses 103 and ground terminal buses 105. The power and ground terminal buses 103, 105 are formed with a modified and simplified geometry as compared to those of FIG. 5—namely as substantially rectangular bus bar pads that extend above two or more adjacent power or ground I/O pads 14, 16, as shown in FIG. 10. In some embodiments, one or more of the power and ground terminal buses 103, 105 may include an optional interconnecting trace 113 (shown in phantom) to enable electrically connecting an outlying single power or ground I/O pad 14, 16 to one of the bussed power and ground terminal buses 103, 105.

After singulating the wafer-level reconfigured semiconductor structure 111 of FIG. 10 or the wafer-level reconfigured semiconductor structure 86 of FIG. 5 into discrete devices, one or more of the singulated reconfigured semiconductor devices 104 may embedded within an electronics package. FIG. 12 depicts one embodiment of an embedded electronics package 106 that includes a reconfigured semiconductor device 104 manufactured with the terminal pad and bus layer 98 of FIG. 5, with the cross-sectional view in FIG. 12 corresponding to Section A-A of FIG. 5. However, it is contemplated that alternative embodiments of embedded electronics package 106 may include a reconfigured semiconductor device manufactured with the terminal pad and bus layer 98 of FIG. 7.

Instead of the solder bumps and copper pillar/solder paste connections of the prior art constructions, embedded chip package 106 includes conductive interconnections to the I/O pads 12, 14, 16 of semiconductor logic device 40 that are formed without any solder. These interconnections are made by way of a multi-layer interconnect structure or overlay interconnect structure 56 that is formed over the top surfaces 203, 204 of the insulating layer 94 and terminal pad and bus layer 98 and the top surface 206 of the insulating material 76. In the illustrated embodiment, overlay interconnect structure 56 includes a base interconnect layer 58 and a first rerouting interconnect layer 60. In other embodiments additional rerouting interconnect layers may be included or the first rerouting interconnect layer 60 may be omitted entirely as appropriate to the terminal pad and bus layer 98.

Base interconnect layer 58 is composed of an insulating layer 62, a patterned conductive wiring layer 64, and conductive vias 66 that extend through a series of vias 84 in the insulating layer 62 and span the thickness of the insulating layer 62 between conductive wiring layer 64 and the terminal pad and bus layer 98. Conductive wiring layer 64 is preferably a patterned metal layer such as aluminum, copper, gold, silver, nickel, or combinations thereof as non-limiting examples. However, other electrically conducting materials or a combination of metal and a filling agent may be used in other embodiments.

In some embodiments, base interconnect layer 58 also includes one or more optional parallel conductive vias 68 (shown in phantom) that are electrically coupled between conductive wiring layer 64 and any or all of the power and ground terminal buses 103, 105 thereby forming parallel electrical connection pathways between a given power or ground terminal bus 103, 105 and the conductive wiring layer 64. The larger footprint of the power and ground terminal buses 103, 105 relative to the underlying I/O pads 14, 16 permits one or more of these parallel conductive vias 68 to be formed to the power and ground terminal buses 103, 105 as desired. While not shown in the figures, two or more of these parallel conductive vias 68 may be formed between the conductive wiring layer 64 and select signal terminal pads 102 in an alternative embodiment. In yet another alternative embodiment, the conductive vias 66 connected to the power and ground terminal pads 103 are larger than (e.g., have a larger diameter) the conductive vias 66 formed to the terminal pads 102, thereby providing increased conductivity to the high current power and ground I/O pads 14, 16. In yet another embodiment, embedded chip package 106 may include a combination of parallel conductive vias 68 and larger conductive vias 66 formed to the power and ground terminal pads 103.

The top surfaces 203, 204 of reconfigured semiconductor logic device 104 are affixed to insulating layer 62 either through adhesive properties of the insulating layer 62 itself or by way of an intermediate bonding or attachment layer (not shown). According to various embodiments, insulating layer 62 may be provided in the form of an insulating film or dielectric substrate, such as for example a Kapton® laminate flex, although other suitable electrically insulating materials may also be employed, such as Ultem®, polytetrafluoroethylene (PTFE), or another polymer film, such as a liquid crystal polymer (LCP) or a polyimide substrate, or inorganic films such as ceramic or glass, as non-limiting examples. Alternatively, insulating layer 62 may be provided as an organic film provided with an adhesive layer, a self-bonding film, such as, for example, an epoxy-fiber glass pre-preg, or a liquid dispensed dielectric that is cured in place.

One or more additional rerouting interconnect layers 60 may be formed atop base interconnect layer 58 to add additional routing capability for more complex semiconductor logic devices. The conductive wiring layer 64 of the topmost interconnect layer 60 is patterned to form module I/O pads 70. Embedded chip package 106 may include optional solder bumps or solder balls 74 (shown in phantom) connected to the module I/O pads 70.

Reconfigured semiconductor logic device 104 is at least partially embedded within an insulating material 76 or molding material that surrounds the side surfaces (and optionally the backside) of reconfigured semiconductor logic device 104 and the exposed bottom surfaces 78 of insulating layer 62. As used herein the phrase "insulating material" refers to an electrically insulating material or molding material that adheres to surrounding components of the electronics package such as a polymeric material (e.g., epoxy, liquid crystal polymer, ceramic or silica filled polymers) or other organic material as non-limiting examples. In one exemplary embodiment, insulating material 76 is an epoxy with filler particles to control the coefficient of thermal expansion (CTE). While insulating material 76 is illustrated as encapsulating the sides and backside of reconfigured semiconductor logic device 104, insulating material 76 may be formed in a manner that leaves the backside of the device 104 exposed in alternative embodiments.

Figure 13:
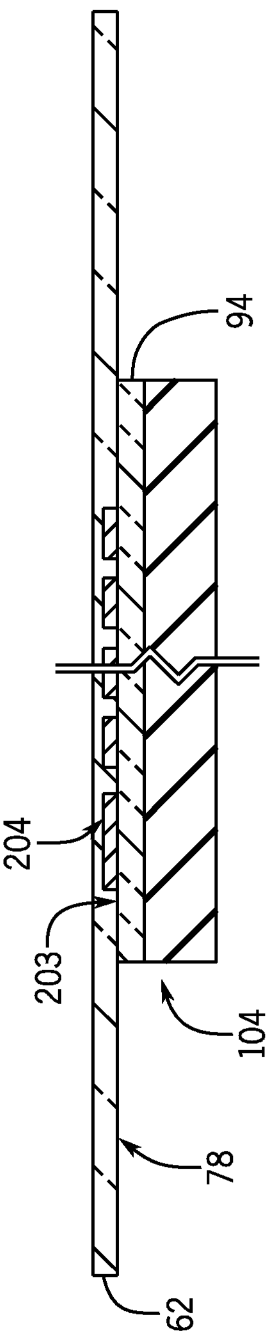
FIGS. 13-15 are schematic cross-sectional side views of an electronics package during various stages of a manufacturing/build-up process, according to an embodiment of the invention.
Figure 14:
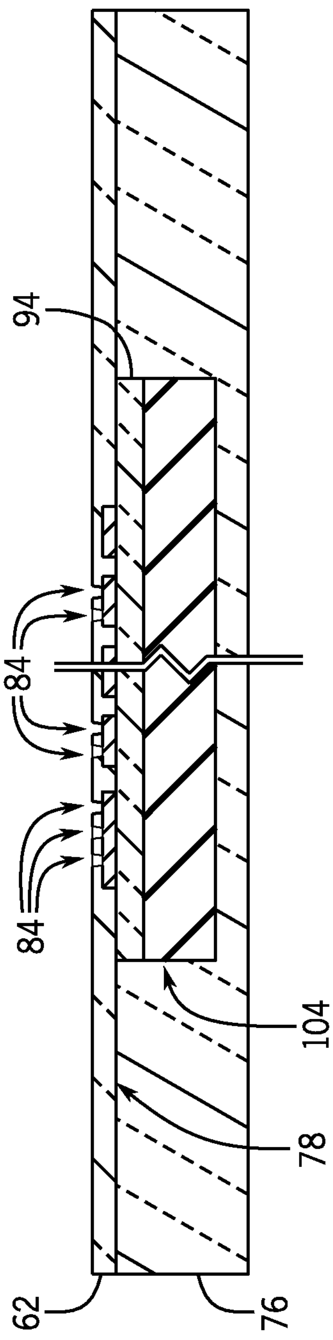
Figure 15:
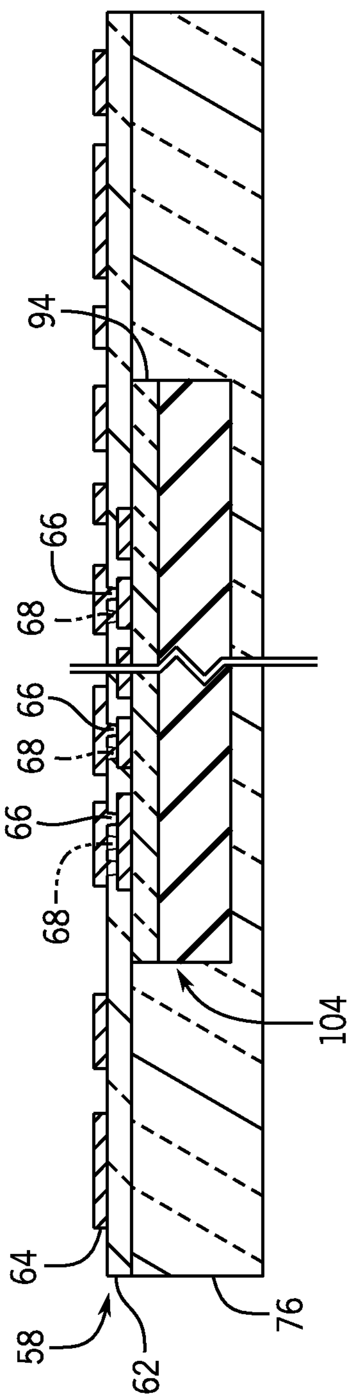

Referring now to FIGS. 13-15, select steps of a technique for manufacturing the embedded chip package 106 is set forth, according to one embodiment of the invention, with each figure illustrating a cross-section of the electronics package 106 during the build-up process. While FIGS. 13-15 illustrate the manufacture of a single electronics package, one skilled in the art will recognize that multiple electronics packages could be manufactured in a similar manner at the panel level and then singulated into individual electronics packages as desired.

Referring first to FIG. 13, fabrication of embedded chip package 106 begins by attaching the top surfaces 203, 204 of reconfigured semiconductor logic device 104 to the bottom surface 78 of insulating layer 62 using conventional pick and place equipment and methods. In some embodiments, such as, for example, embodiments where insulating layer 62 is provided in either an uncured or partial cured (i.e., B-stage) form and has adhesive properties, reconfigured semiconductor logic device 104 is attached directly to insulating layer 62. Alternatively, an organic adhesive (not shown) can be applied either on insulating layer 62 or on the top surfaces 203, 204 of reconfigured semiconductor logic device 104 prior to positioning device 104 on insulating layer 62. One or both of top surfaces 203, 204 are coplanar or substantially coplanar with the top surface of insulating material 76.

The manufacturing process continues in FIG. 14 by dispensing an insulating material 76 over and around the reconfigured semiconductor logic device 104, thereby encapsulating the exposed portions of the bottom surface 78 of insulating layer 62, the side surfaces of reconfigured semiconductor logic device 104, and (optionally) the backside surface of device 104. According to alternative and non-limiting embodiments, insulating material 76 may be applied using a spin coating, pour molding, transfer molding, injection molding, or compression molding process. Insulating layer 62 and insulating material 76 are fully cured, thermally or by way of a combination of heat or radiation. Suitable radiation may include UV light and/or microwaves. In one embodiment, a partial vacuum and/or above atmospheric pressure may be used to promote the removal of volatiles from the insulating layer 62 and insulating material 76.

A plurality of vias 84 are formed through insulating layer 62. As shown, vias 84 are formed to expose the signal, ground, and power I/O pads 12, 14, 16 of semiconductor logic device 40. Vias 84 may be formed by a direct write UV laser by laser ablation. Alternately, vias 84 may be formed by way of other methods utilizing a mask including: plasma etching, wet etching, photo-definition or other laser techniques like CO2 and excimer. In one embodiment, vias 84 are formed having angled side surfaces to facilitate the subsequent metal deposition step. Alternatively, vias 84 may be straight-sided. Vias 84 are subsequently cleaned such as through a reactive ion etching (RIE) desoot process or laser process.

The manufacturing technique continues by forming and patterning the conductive wiring layer 64 on insulating layer 62, as illustrated in FIG. 15. Conductive wiring layer 64 may be formed using any of the same techniques and materials as described for conductive layer 97 (FIG. 8). After conductive wiring layer 64 is complete, additional redistribution or routing layers such as rerouting interconnect layer 60 (FIG. 12) may be formed atop base interconnect layer 58 using known techniques such as, for example, application of a spun on or flowable film followed by sputtering, plating, and a lithography process. The conductive wiring layer 64 on the topmost rerouting interconnect layer 58 or 60 is patterned to form module I/O pads 70. Thereafter, optional solder bumps or solder balls 74 (shown in phantom) may be formed on or attached to the module I/O pads 70 to yield the embedded chip package 106 of FIG. 12.

One skilled in the art will recognize that alternative materials and process steps could be used to form the embedded chip package 106 of FIG. 12. For example, reconfigured semiconductor logic device 104 could be molded into insulating material 76 prior to bonding the device 104 to the insulating layer 62. In such an embodiment, base interconnect layer 58 would be laminated over the reconfigured semiconductor logic device 104 and the upper surface 206 of the insulating material 76.

Figure 16:
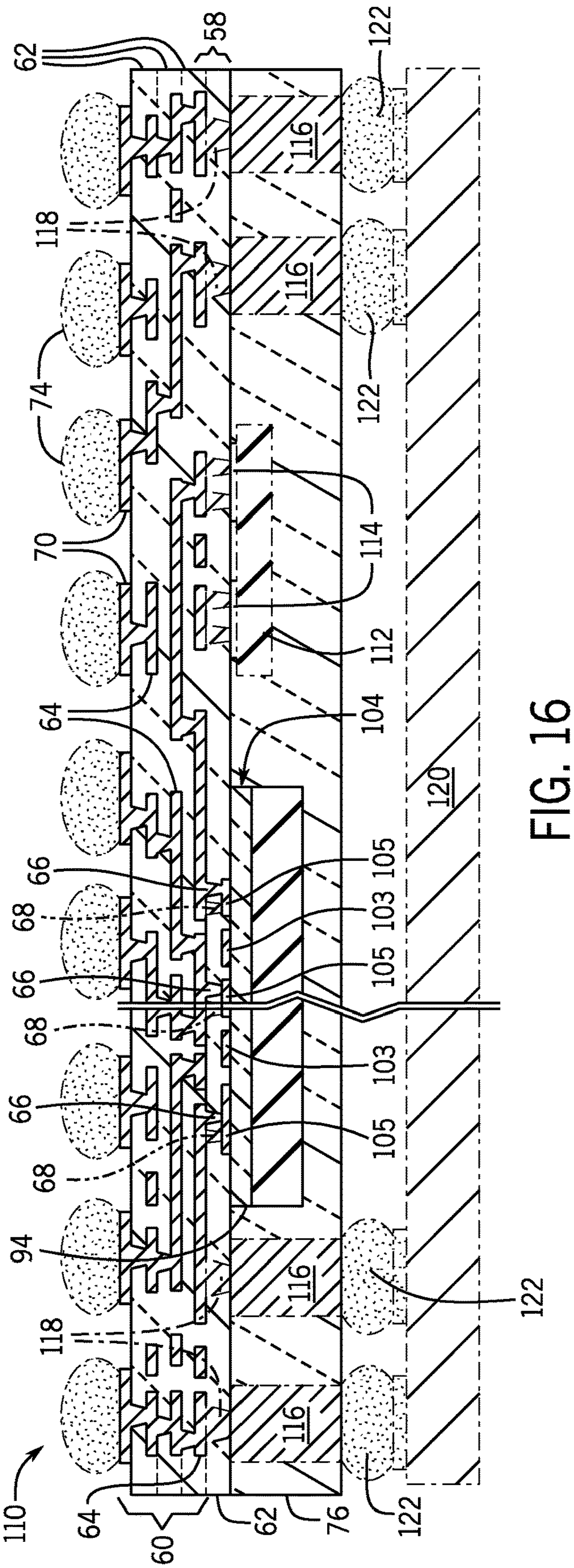
FIG. 16 is a schematic cross-sectional view of an electronic package including a reconfigured semiconductor logic device, according to another embodiment of the invention.

Referring now to FIG. 16, an embedded multichip module 110 is illustrated according to an embodiment of the invention. Embedded multichip module 110 includes reconfigured semiconductor logic device 104, again depicted relative to Section A-A of FIG. 5, at least one additional component, and a number of other elements similar to those described above with respect to FIGS. 5-12, which are referred to with common part numbering with respect to FIG. 16.

Similar to embedded chip package 106 of FIG. 12, embedded multichip module 110 includes a reconfigured semiconductor logic device 104 attached to the bottom surface 78 of the insulating layer 62 of base interconnect layer 58. In some embodiments, embedded multichip module 110 also includes at least one additional microelectronics device 112 (shown in phantom) embedded within insulating material 76 adjacent reconfigured semiconductor logic device 104. According to exemplary embodiments, microelectronics device 112 may be a semiconductor device, a passive device, a MEMS device, an acoustic device, or other type of electrical component. The conductive wiring layer 64 of the base interconnect layer 58 is electrically coupled to the terminal pads 102 and terminal buses 103, 105 of reconfigured semiconductor logic device 104 and to contact pads 114 of microelectronics device 112. In the illustrated embodiment, embedded multichip module 110 includes three rerouting interconnect layers 60 formed atop base interconnect layer 58. However, more or less rerouting interconnect layers 60 may be included in alternative embodiments based on the desired I/O routing structure and module complexity. Similar to the configuration described with respect to FIG. 12, base interconnect layer 58 may be constructed with one or more optional conductive vias 68 (shown in phantom).

Optionally, embedded multichip module 110 includes one or more through connectors or through molding vias (TMVs) 116 (shown in phantom), which are formed through the thickness of insulating material 76 and bring selected signals, power, and ground connections to the bottom surface of the insulating material 76 to facilitate connection to other circuitry. Through connectors 116 are preferably metal such as, for example, copper, aluminum, or stainless steel, but may be any type of electrically conductive material in alternative embodiments. Through connectors 116 may be formed by any known technique such as electroless plating and/or electroplating for example. These through connectors 116 are electrically coupled to conductive wiring layer 64 by way of additional metalized vias 118 (also shown in phantom).

Embedded multichip module 110 may also include an optional second microelectronics package 120 (shown in phantom) mounted to the through connectors 116 with optional solder balls 122 (shown in phantom) to form a package-on-package structure. Microelectronics package 120 may include one semiconductor device or multiple semiconductor devices such as, for example, a stack of memory chips within an area array package. Microelectronics package 120 may be mounted to one or more of the module I/O pads 70 in an alternative embodiment.

Figure 17:
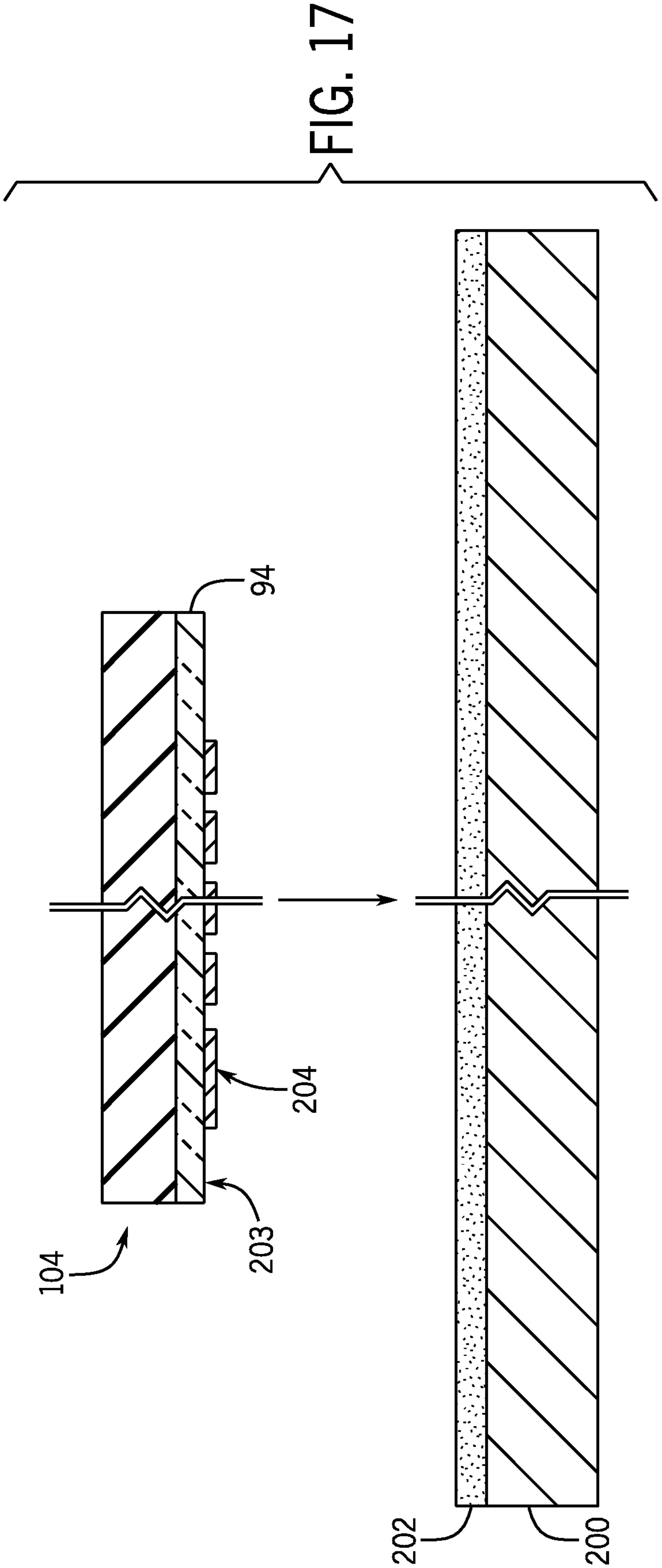
FIGS. 17-19 are schematic cross-sectional side views illustrating various stages of a process for embedding a reconfigured semiconductor logic device, according to an embodiment of the invention.
Figure 18:
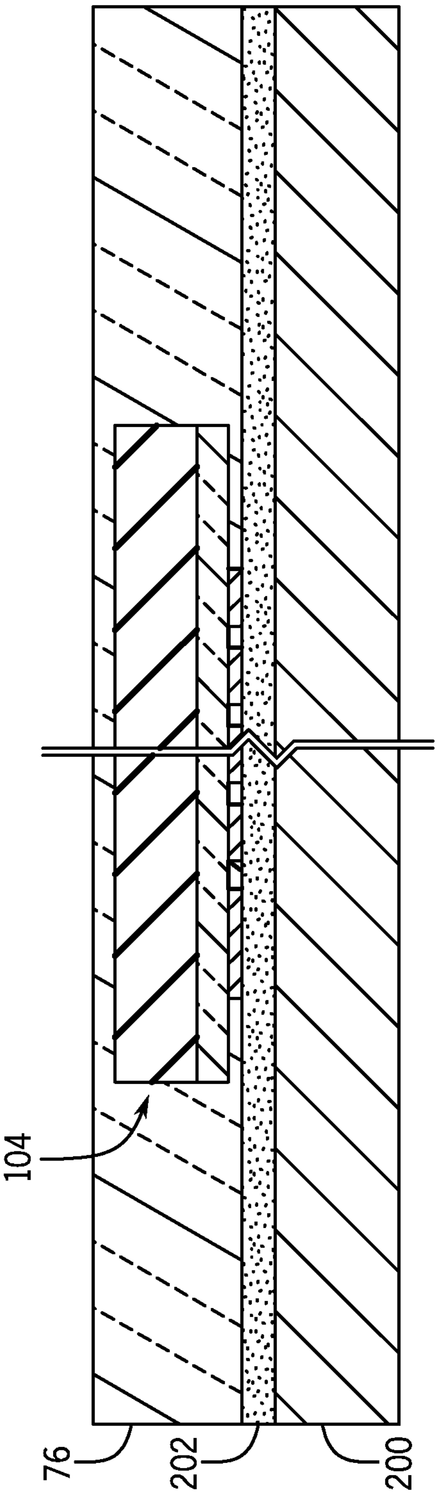
Figure 19:
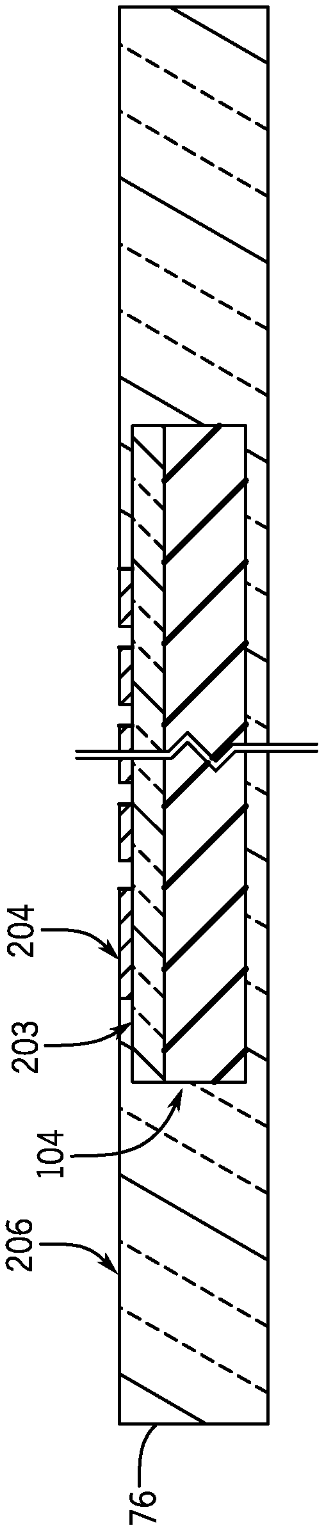

FIGS. 17-19 depict an alternative method of embedding a reconfigured semiconductor logic device 104, according to an embodiment of the invention. Referring first to FIG. 17, the method begins by coating a plate or platen 200 with a layer of temporary adhesive or bonding material 202. The singulated reconfigured semiconductor logic device 104 is placed active surface 204 down onto the layer of temporary bonding material 202 as shown in FIG. 18. Next, molding resin or insulating material 76 is dispensed to embed the device 104 and exposed portions of the temporary bonding material 202. In some embodiments, insulating material 76 is dispensed in a manner that leaves the backside of the device 40 exposed. Insulating material 76 can be dispensed by one of injection molding, compression molding, pour molding and fluid jetting, as non-limiting examples. After curing insulating material 76, the combined assembly of cured insulating material 76 and device 104 is removed from the temporary bonding material 202 and platen 200. As shown in FIG. 19, the active surface 204 of device 104 is co-planar or substantially co-planar with the top surface 206 of the cured insulating material 76. At this point, one or more interconnect layers 58, 60 can be formed over the device 104 and the top surface 206 of insulating material 76.

While devices 104 are described herein as being incorporated within an embedded chip package, it is also contemplated that singulated devices could also be used in flip chip applications. In such applications, a passivation layer or dielectric mask layer could be formed over the top surface of terminal pad and bus layer 98. Openings would be formed through the passivation/dielectric mask layer to permit solder attach.

Beneficially, embodiments of this invention provide the capability of reducing the die size of a complex, high I/O count semiconductor logic device by forming a reconfiguration or redistribution layer that includes bussed connections to underlying power and ground I/O pads on the semiconductor logic device. These bussed connections form contact points with higher current carrying capability and lower interconnect parasitics within the embedded chip module. Also, multiple conductive vias can be formed to each terminal bus structure, a common power or ground I/O pad, which provides increased conductivity and redundant, parallel electrical connections between the interconnect structure of the embedded package and the reconfiguration layer on the semiconductor logic device, thereby increasing layer-to-layer conductivity and interconnect yields associated with interconnect defects.

The redistribution layer also permits the underlying semiconductor logic device to be designed with a smaller footprint than capable for flip chip or wire bond assembly, thereby increasing the number of die per wafer and thus lowering fabrication costs. In the case of a typical 10-15% feature size reduction, embodiments of the invention permit a semiconductor logic chip to be designed with a 20-30% die size reduction and a potential 15-20% reduction in wafer fabrication costs.

On the package-level, embodiments of the invention provide for higher power delivery and higher semiconductor logic device performance than state-of-the-art flip chip solder bump approaches, including a ten-fold reduction in interconnect resistance, a ten-fold increase in current carrying capability and a thinner package as compared with flip chip solder bump. The electrical interconnections to the I/O pads 12, 14, 16 of semiconductor logic device 40 are not susceptible to solder fatigue, electro-migration, or pad-to-pad solder shorts since they are formed without solder. Further, use of embedded chip assembly permits a complex semiconductor logic device with thousands of I/O pads to undergo a die shrink without losing electrical performance. Embodiments of the invention disclosed herein also provide higher electrically performance and higher interconnect yield than prior art embedded semiconductor chip packages, with a four-fold reduction in interconnect resistance, and a four-fold increase in current carrying capability compared to other embedded chip approaches. Accordingly, the embodiments described herein provide a low-cost solution with higher performance as compared to prior art approaches.

Therefore, according to one embodiment of the invention, a reconfigured semiconductor logic device includes a semiconductor logic device comprising a plurality of input/output (I/O) pads formed on an active surface thereof and a redistribution layer. The redistribution layer comprises an insulating layer formed atop the active surface of the semiconductor logic device such that the insulating layer does not extend beyond an outer perimeter of the active surface and a patterned conductive wiring layer positioned above the insulating layer. The patterned conductive wiring layer includes a plurality of terminal buses formed on a top surface of the insulating layer. Each terminal bus of the plurality of terminal buses is electrically coupled to multiple I/O pads of the plurality of I/O pads through vias formed in the insulating layer.

According to another embodiment of the invention, a method of manufacturing a reconfigured semiconductor logic device includes disposing an insulating layer over an active surface of a semiconductor logic device and forming a plurality of vias through a thickness of the insulating layer to expose a plurality of input/output (I/O) pads located on the active surface of the semiconductor logic device. The method also includes forming at least one patterned conductive layer above a top surface the insulating layer and into the plurality of vias, the at least one patterned conductive layer comprising at least one terminal bus that is electrically coupled to multiple I/O pads of the plurality of I/O pads through multiple vias of the plurality of vias.

According to yet another embodiment of the invention, an embedded electronics package includes an insulating material and a reconfigured semiconductor device at least partially embedded within the insulating material. The reconfigured semiconductor device includes a semiconductor device having an active surface with a plurality of input/output (I/O) pads arranged thereon and a redistribution layer. The redistribution layer comprises an insulating layer having a first surface disposed on the active surface of the semiconductor device and a conductive wiring layer comprising at least one bus bar formed on a second surface of the insulating layer. Each of the at least one bus bar is electrically coupled to at least two of the plurality of I/O pads through the insulating layer. A multi-layer interconnect structure is formed over the insulating material and the reconfigured semiconductor device. The multi-layer interconnect structure is electrically coupled to the semiconductor device by way of the conductive wiring layer.

According to yet another embodiment of the invention, a method of forming an embedded electronics package includes embedding a reconfigured semiconductor device within an insulating material such that a top surface of the reconfigured semiconductor device and a top surface of the insulating material are co-planar or substantially co-planar, the reconfigured semiconductor device comprising a semiconductor device and at least one bus bar that electrically couples the top surface of the reconfigured semiconductor device to a plurality of I/O pads located on an active surface of the semiconductor device through an insulating layer formed on the active surface. The method further includes forming an overlay interconnect structure over the top surface of the insulating material and the top surface of the reconfigured semiconductor device. The overlay interconnect structure comprises at least one conductive wiring layer electrically coupled to the plurality of I/O pads through the at least one bus bar.

While the invention has been described in detail in connection with only a limited number of embodiments, it should be readily understood that the invention is not limited to such disclosed embodiments. Rather, the invention can be modified to incorporate any number of variations, alterations, substitutions or equivalent arrangements not heretofore described, but which are commensurate with the spirit and scope of the invention. Additionally, while various embodiments of the invention have been described, it is to be understood that aspects of the invention may include only some of the described embodiments. Accordingly, the invention is not to be seen as limited by the foregoing description, but is only limited by the scope of the appended claims.

What is claimed is:

1. A reconfigured semiconductor logic device comprising:

a semiconductor logic device comprising a plurality of input/output (I/O) pads formed on an active surface thereof; and a redistribution layer comprising:

an insulating layer formed atop the active surface of the semiconductor logic device such that the insulating layer does not extend beyond an outer perimeter of the active surface; and a patterned conductive wiring layer comprising a plurality of terminal buses formed on a top surface of the insulating layer, each terminal bus of the plurality of terminal buses electrically coupled to multiple I/O pads of the plurality of I/O pads through vias formed in the insulating layer.

2. The reconfigured semiconductor logic device of claim 1 wherein a terminal bus of the plurality of terminal buses is electrically coupled to at least two adjacent power I/O pads or at least two adjacent ground I/O pads of the plurality of I/O pads.

3. The reconfigured semiconductor logic device of claim 2 wherein a first terminal bus of the plurality of terminal buses is electrically coupled to at least two adjacent power I/O pads of the plurality of I/O pads; and wherein a second terminal bus of the plurality of terminal buses is electrically coupled to at least two adjacent ground I/O pads of the plurality of I/O pads.

4. The reconfigured semiconductor logic device of claim 1 wherein at least a subset of the plurality of I/O pads are spaced at a non-solderable pitch.

5. The reconfigured semiconductor logic device of claim 4 wherein the non-solderable pitch is less than or equal to 130 microns.

6. The reconfigured semiconductor logic device of claim 1 wherein a terminal bus of the plurality of terminal buses comprises at least one bus pad and a plurality of conductive traces extending outward from the at least one bus pad; and wherein the at least one bus pad and the plurality of conductive traces are formed on the second surface of the insulating layer.

7. The reconfigured semiconductor logic device of claim 1 wherein a terminal bus of the plurality of terminal buses comprises a series of bus pads electrically coupled to one another by conductive traces that extend between adjacent bus pads in the series of bus pads; and wherein the series of bus pads and the conductive traces are formed on the second surface of the insulating layer.

8. The reconfigured semiconductor logic device of claim 1 further comprising a plurality of discrete terminal pads formed on the top surface of the insulating layer and electrically connected to respective signal I/O pads of the plurality of I/O pads through additional vias formed in the insulating layer.

9. The reconfigured semiconductor logic device of claim 8 wherein the plurality of discrete terminal pads have a larger surface area than their respective signal I/O pads.

10. A method of manufacturing a reconfigured semiconductor logic device comprising:

disposing an insulating layer over an active surface of a semiconductor logic device;

forming a plurality of vias through a thickness of the insulating layer to expose a plurality of input/output (I/O) pads located on the active surface of the semiconductor logic device; and forming at least one patterned conductive layer above a top surface the insulating layer and into the plurality of vias, the at least one patterned conductive layer comprising at least one terminal bus that is electrically coupled to multiple I/O pads of the plurality of I/O pads through multiple vias of the plurality of vias.

11. The method of claim 10 wherein forming the at least one patterned conductive layer comprises:

plating a conductor layer on the top surface of the insulating layer and into the plurality of vias;

patterning the conductor layer to form at least one ground terminal bus electrically coupled to multiple adjacent ground I/O pads of the plurality of I/O pads; and patterning the conductor layer to form at least one power terminal bus electrically coupled to multiple adjacent power I/O pads of the plurality of I/O pads.

12. The method of claim 10 further comprising forming the at least one patterned conductive layer to include a plurality of discrete terminal pads electrically coupled to respective signal I/O pads of the plurality of I/O pads.

13. The method of claim 10 further comprising forming the at least one patterned conductive layer to include a plurality of terminal buses, each of the plurality of terminal buses electrically isolated from the other terminal buses on the top surface of the insulating layer and coupled to multiple adjacent I/O pads of the plurality of I/O pads.

14. An embedded electronics package comprising:

an insulating material;

a reconfigured semiconductor device at least partially embedded within the insulating material, the reconfigured semiconductor device comprising:

a semiconductor device having an active surface with a plurality of input/output (I/O) pads arranged thereon; and a redistribution layer comprising:

an insulating layer having a first surface disposed on the active surface of the semiconductor device; and a conductive wiring layer comprising at least one bus bar formed on a second surface of the insulating layer, each of the at least one bus bar electrically coupled to at least two of the plurality of I/O pads through the insulating layer; and a multi-layer interconnect structure formed over the insulating material and the reconfigured semiconductor device, the multi-layer interconnect structure electrically coupled to the semiconductor device by way of the conductive wiring layer.

15. The embedded electronics package of claim 14 wherein the conductive wiring layer further comprises a plurality of discrete terminal pads formed on the second surface of the insulating layer, each of the plurality of discrete terminal pads electrically coupled to a respective signal I/O pad of the plurality of I/O pads through the insulating layer.

16. The embedded electronics package of claim 14 wherein the at least one bus bar comprises:

at least one ground bus bar electrically coupled to at least two ground I/O pads of the plurality of I/O pads through the insulating layer; and at least one power bus bar electrically coupled to at least two power I/O pads of the plurality of I/O pads through the insulating layer.

17. The embedded electronics package of claim 14 wherein the conductive wiring layer extends through a plurality of vias in the insulating layer to electrically couple the at least one bus bar to at least two of the plurality of I/O pads.

18. The embedded electronics package of claim 14 wherein the plurality of I/O pads are arranged on the active surface of the semiconductor device in a grid with a uniform x-axis and y-axis pitch equal to or less than 130 microns.

19. The embedded electronics package of claim 14 wherein the semiconductor device comprises a semiconductor logic device having at least 100 I/O pads.

20. The embedded electronics package of claim 14 wherein multi-layer interconnect structure further comprises a first interconnect layer comprising;

an interconnect insulating layer having a first surface disposed over the redistribution layer and the insulating material; and an interconnect conductive wiring layer overlying a second surface of the interconnect insulating layer and extending into a plurality vias extending through the interconnect insulating layer to the at least one bus bar of the conductive wiring layer.

21. The embedded electronics package of claim 14 further comprising a plurality of electrically conductive connections that extend from a top surface of the insulating material to a bottom surface of the insulating material; and wherein the conductive wiring layer is electrically connected to the plurality of the electrically conductive connections.

22. The embedded electronics package of claim 14 further comprising connection terminals formed on an outer surface of the multi-layer interconnect structure, the connection terminals electrically connected to the plurality of I/O pads.

23. The embedded electronics package of claim 22 further comprising a second semiconductor device mounted to one of the outer surface of the multi-layer interconnect structure and a bottom surface of the insulating material, the second semiconductor device electrically connected the multi-layer interconnect structure.

24. The embedded electronics package of claim 14 further comprising an electrical component embedded within the insulating material and electrically connected to the multi-layer interconnect structure.

25. A method of forming an embedded electronics package comprising:

embedding a reconfigured semiconductor device within an insulating material such that a top surface of the reconfigured semiconductor device and a top surface of the insulating material are co-planar or substantially co-planar, the reconfigured semiconductor device comprising a semiconductor device and at least one bus bar that electrically couples the top surface of the reconfigured semiconductor device to a plurality of I/O pads located on an active surface of the semiconductor device through an insulating layer formed on the active surface; and forming an overlay interconnect structure over the top surface of the insulating material and the top surface of the reconfigured semiconductor device, the overlay interconnect structure comprising at least one conductive wiring layer electrically coupled to the plurality of I/O pads through the at least one bus bar.

26. The method of claim 25 wherein forming the overlay interconnect structure comprises:

dispensing a base insulating layer over the top surface of the insulating material and the top surface of the reconfigured semiconductor device;

forming a plurality of vias through the base insulating layer to expose the at least one bus bar; and forming a patterned conductive wiring layer atop the base insulating layer, the patterned conductive wiring layer extending into the plurality of vias to create parallel electrical connections to the at least one bus bar.

27. The method of claim 25 further comprising:

embedding an electrical component within the insulating layer such that a top surface of the electrical component and the top surface of the insulating material are co-planar or substantially co-planar; and forming the overlay interconnect structure to electrically couple with the electrical component.

28. The method of claim 25 further comprising mounting at least one additional component within the insulating material with a top surface of the at least one additional component co-planar or substantially co-planar with the surface of the insulating material.

29. The method of claim 25 further comprising forming a plurality of electrically conductive connections through the insulating material; and electrically connecting the multi-layer interconnect structure to at least selected ones of the plurality of electrically conductive connections.

* * * * *